(12) United States Patent
Ghosh et al.

(10) Patent No.: US 9,900,022 B2
(45) Date of Patent: Feb. 20, 2018

(54) DIGITAL TO ANALOG CONVERTER WITH PASSIVE RECONSTRUCTION FILTER

(71) Applicant: TEXAS INSTRUMENTS INCORPORATED, Dallas, TX (US)

(72) Inventors: Diptendu Ghosh, West Bengal (IN); Petteri Matti Litmanen, Richardson, TX (US); Siraj Akhtar, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/408,396

(22) Filed: Jan. 17, 2017

(65) Prior Publication Data
US 2017/0207795 A1    Jul. 20, 2017

Related U.S. Application Data

(60) Provisional application No. 62/279,183, filed on Jan. 15, 2016.

(51) Int. Cl.
*H03M 1/66* (2006.01)
*H03H 7/01* (2006.01)

(52) U.S. Cl.
CPC .......... *H03M 1/661* (2013.01); *H03H 7/0115* (2013.01)

(58) Field of Classification Search
None
See application file for complete search history.

(56) References Cited

U.S. PATENT DOCUMENTS

| | | | |
|---|---|---|---|
| 6,861,968 B2* | 3/2005 | Melanson | H03M 3/344 341/118 |
| 9,190,977 B2* | 11/2015 | Kihara | H03H 7/0115 |
| 9,306,603 B2* | 4/2016 | Lee | H04B 1/0053 |

* cited by examiner

*Primary Examiner* — Howard Williams
(74) *Attorney, Agent, or Firm* — Andrew Viger; Charles A. Brill; Frank D. Cimino

(57) ABSTRACT

DAC design uses a passive reconstruction filter. The reconstruction filter includes a notch filter and series peaking filter. The notch filter provides notch filtering at the DAC clock frequency. The peaking filter increases signal bandwidth while attenuating frequency content at harmonics of the DAC clock frequency. The notch filter can be an LC notch filter with a notch inductor Ln and a notch capacitor Cn. The peaking filter can be a series peaking inductor Ls (shunted with a filter capacitor Cp). In a differential configuration, the passive reconstruction filter can be ±LC notch filters (with ±Ln notch inductors), and the peaking filter can be ±Ls peaking inductors coupled in series to the ±LC notch filters. The ±Ln notch inductors, ±Ls peaking inductors can be mutually wound as single inductors. For an example direct conversion RF transmit chain, IQ± signal paths are implemented with differential DAC designs including passive reconstruction filters.

20 Claims, 2 Drawing Sheets

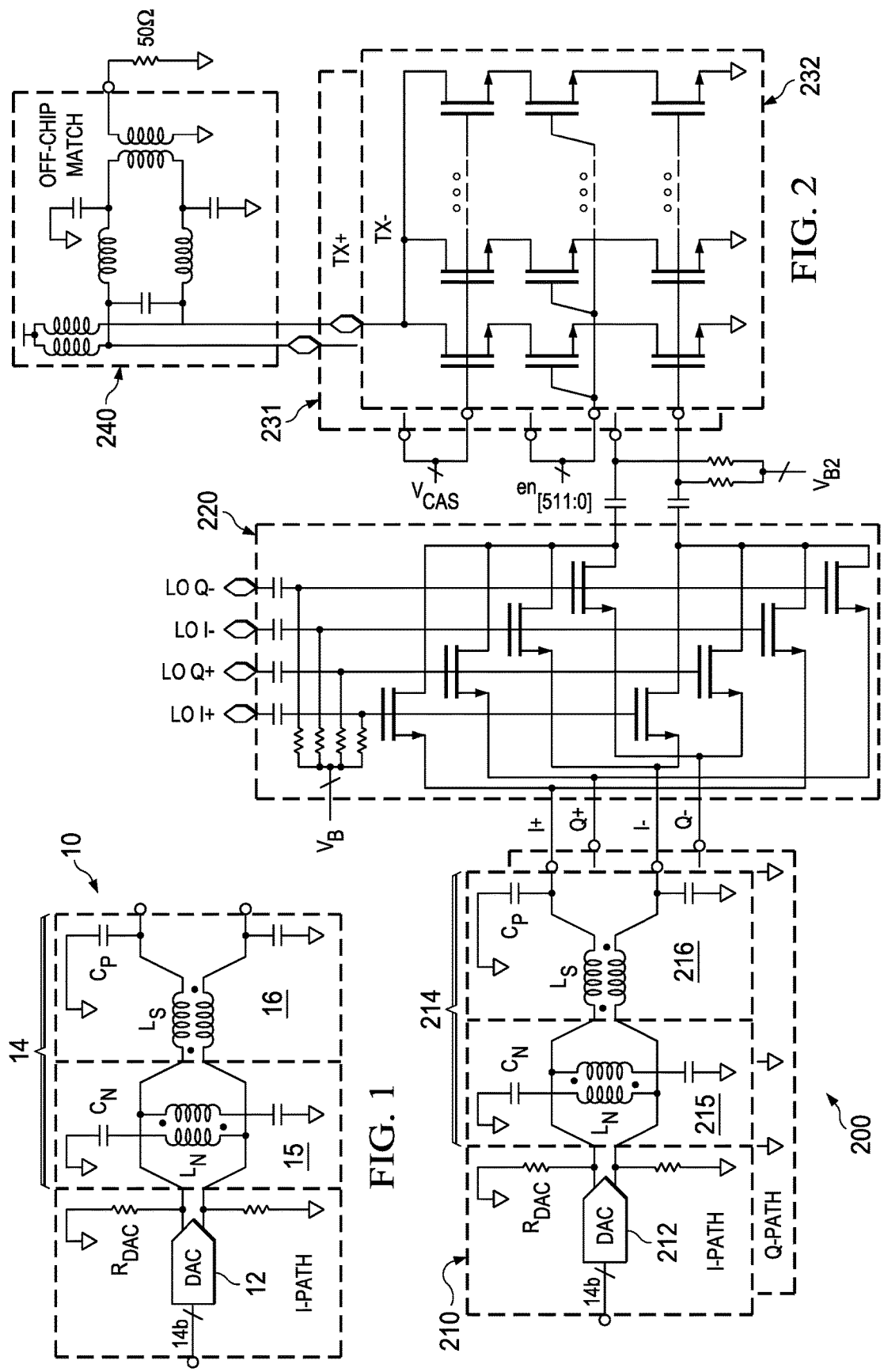

DIGITAL TO ANALOG CONVERTER WITH PASSIVE RECONSTRUCTION FILTER

CROSS-REFERENCE TO RELATED APPLICATIONS

Priority is claimed under 37 CFR 1.78 and 35 USC 119(e) to U.S. Provisional Application 62/279,183, filed 15 Jan. 2016), which is incorporated by reference.

BACKGROUND

Technical Field

This Patent Disclosure relates generally to digital to analog converters.

Related Art

Digital to Analog Converters (DACs) convert digital data into a sequence of impulses that are then processed by a reconstruction filter to band limit the DAC output, removing spurious high-frequency content. Reconstruction filters are also referred to as anti-imaging filters in that they prevent imaging by smoothing the DAC output waveform to remove image frequencies above the Nyquist limit. For example, in the case of RF transmitter applications, reconstruction filters remove DAC images prior to upconversion.

Reconstruction filters can be implemented with active RC filter circuits, avoiding the use of external inductors. Disadvantages of active reconstruction filters include power consumption, and sub-optimal noise and linearity.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for a DAC (digital to analog converter) design with passive reconstruction filter, such as for use in a direct conversion RF transmitter with IQ± signal paths.

According to aspects of the Disclosure, a DAC design uses a passive reconstruction filter. The DAC design includes a DAC coupled to receive an input digital data signal, to convert the digital data signal to a DAC output signal, and a reconstruction filter to filter the DAC output signal. The reconstruction filer includes at least one notch filter to provide notch filtering, and a peaking filter coupled in series with the notch filter, the reconstruction filter providing a filtered DAC output signal that is band limited. For an example application in a direct conversion RF transmit signal chain including an IQ± signal paths I-Path and Q-Path, the I-Path can include an I-Path differential DAC and an I-Path reconstruction filter providing filtered I-Path differential DAC outputs I±, and the Q-Path can include a Q-Path differential DAC and Q-Path reconstruction filter providing filtered Q-Path differential DAC outputs Q±.

In other aspects of the Disclosure, a DAC circuit for use in an RF (radio frequency) transmitter, includes a DAC coupled to receive an input digital data signal, to convert the digital data signal to a DAC RF signal. A reconstruction filter to filter the DAC RF signal, including at least one notch filter to provide notch filtering, and a peaking filter coupled in series with the notch filter, the reconstruction filter providing a filtered DAC RF signal that is band limited.

In other aspects of the Disclosure, a method of digital-to-analog conversion suitable for use in an RF (radio frequency) transmit (TX) signal chain, includes converting an input digital data signal to a DAC RF signal, followed by reconstruction filtering the DAC RF signal, by notch filtering the DAC RF signal with a notch filter an LC notch filter with at least one notch inductor Ln and at least one notch capacitor Cn, and filtering the notch filtered output of the notch filter with a peaking filter including a peak filtering inductor Ls to provide a filtered DAC RF signal that is band limited.

Other aspects and features of the invention claimed in this Patent Document will be apparent to those skilled in the art from the following Disclosure.

BRIEF DESCRIPTION OF THE DRAWINGS

FIG. 1 illustrates an example digital to analog converter (DAC) design [10], including a DAC [12] and a passive reconstruction filter [14, 15/16] according to this Disclosure.

FIG. 2 illustrates an example differential DAC [210] with a passive reconstruction filter [214, 215/216], implemented in the differential IQ± signal paths of a direct conversion RF transmitter design [200].

DETAILED DESCRIPTION

Figure 3:
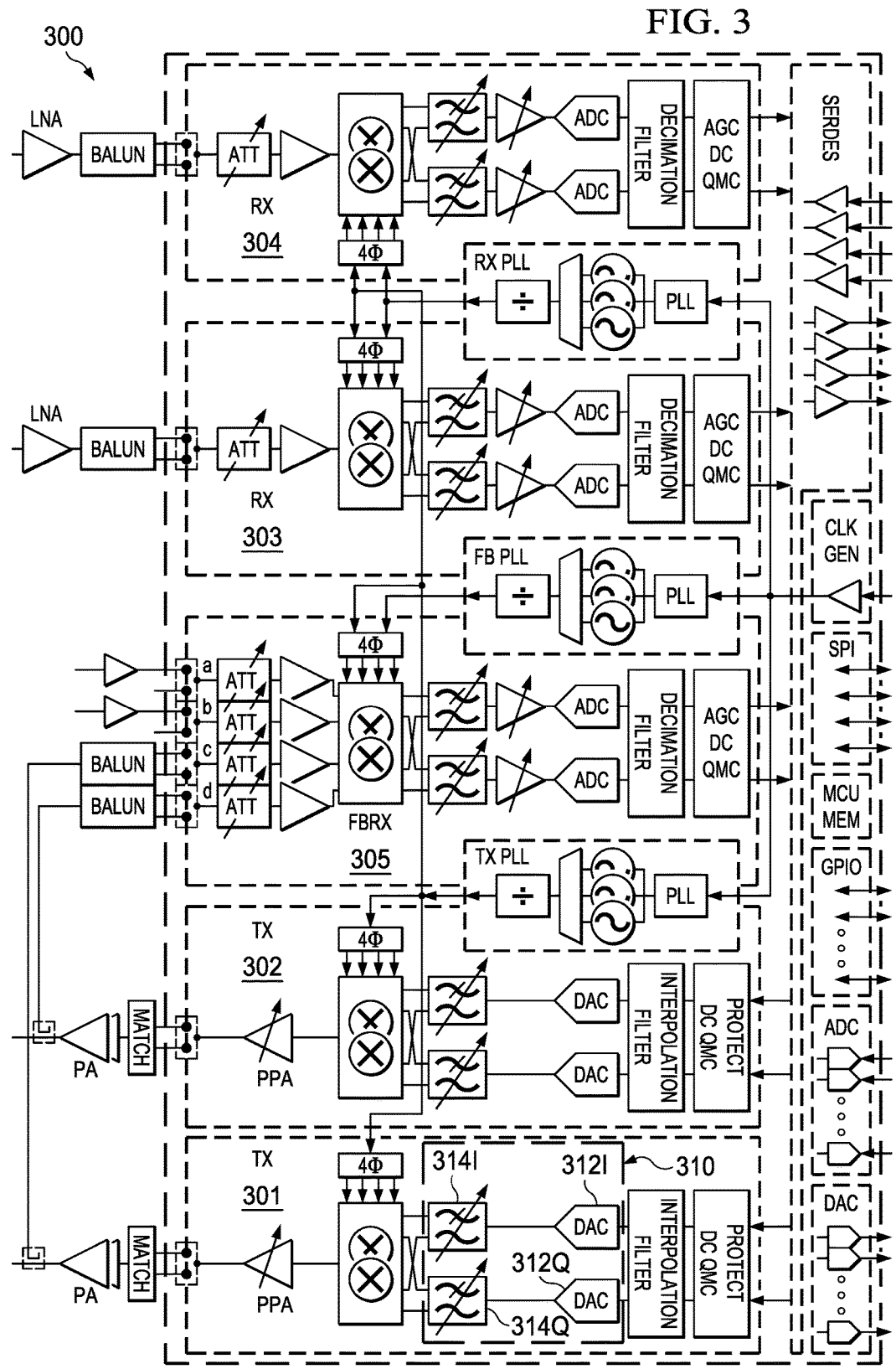
FIG. 3 illustrates an example direct conversion TX/RX transceiver design [300], including dual TX signal chains [301/302], each including differential IQ± signal paths implemented with a DAC [312I/312Q] and passive reconstruction filter [314I/314Q] according to this Disclosure.

This Description and the Drawings constitute a Disclosure for a DAC design with a passive reconstruction filter, including describing examples, and illustrating various technical features and advantages.

In brief overview a DAC design uses a passive reconstruction filter. The reconstruction filter includes a notch filter and series peaking filter. The notch filter provides notch filtering at the DAC clock frequency. The peaking filter provides low pass filter with peaking in the signal passband to increase signal bandwidth while attenuating frequency contents at harmonics of the DAC clock frequency. The notch filter can be an LC notch filter with at least one notch inductor Ln and at least one notch capacitor Cn. The peaking filter can be a series peaking inductor Ls (shunted with a filter capacitor Cp). In a differential configuration, the passive reconstruction filter can be configured with ±LC notch filters (with ±Ln notch inductors), and the peaking filter can be ±Ls peaking inductors coupled in series to the ±LC notch filters. The ±Ln notch inductors, ±Ls peaking inductors can be mutually wound as single inductors. For an example direct conversion RF transmit chain, IQ± signal paths are implemented with differential DAC designs including passive reconstruction filters.

FIG. 1 illustrates an example DAC (digital to analog converter) design 10, including a differential DAC 12 and a passive reconstruction filter 14 according to this Disclosure.

The example passive reconstruction filter 14 is configured with an example notch filter 15 and example series peaking filter 16. The notch filter provides notch filtering at the DAC clock frequency. The peaking filter provides low pass filter with peaking in the signal passband. The order of the notch filter and the peaking filter is a design choice. The use of multiple successive notch filters is a design choice.

For the example differential DAC design, the reconstruction filter 14 includes ±LnCn notch filters 15, series coupled to ±Ls peaking inductors. The peaking circuit includes a shunt filter capacitor Cp referred to a circuit common.

The notch filter 15 suppresses DAC output images. The peaking filter 16 provides bandwidth enhancement using inductive peaking while attenuating frequency contents at harmonics of the DAC clock frequency. That is, the passive reconstruction filter 14 (notch filter 15 with peaking circuit 16) is able to suppress DAC images while maximizing signal bandwidth.

FIG. 2 illustrates an example DAC design 210 implemented in the differential IQ± signal paths of a direct conversion RF transmitter design 200. The DAC design 210 includes a differential DAC 212 and a passive reconstruction filter 214, with ±LnCn notch filters 215, and series ±Ls peaking inductors 216. For the example implementation, the notch filters 215 are connected to differential DAC outputs, followed in the signal path by the series peaking inductors 216.

The RF transmitter design includes upconversion mixers 220 driven by LO (local oscillator) signals LO IQ±, and TX± PPAs (pre-power amplifiers) 231/232, driving out IQ TX RF signals through an external match circuit 240.

For the example RF transmitter application, the example passive reconstruction filter design 214 takes advantage of the use of oversampling to bring down quantization noise, so that the DAC images are at a frequency significantly higher than baseband, facilitating the use of integrated inductors. The LC notch filter 215 is used to suppress these images, but they impact band droop. The peaking inductor 216 is used to counter the band-droop effects of the LC notch filter, enhancing bandwidth.

The example differential DAC design 210, in which the passive reconstruction filter 214 is constructed with ±LnCn notch filters and ±Ls peaking inductors, takes advantage of mutual coupling for the configuration of the inductors. The four inductors for the differential implementation (two for notching $L_N$ and two for peaking $L_S$) are implemented using two mutually wound inductors. This configuration reduces filter size, and can enhance filter performance.

That is, the example DAC design with passive reconstruction filter according to this Disclosure is able to take advantage of mutual inductance so that the four inductors (±Ln and ±Ls) become two. The notch inductors ±Ln (215) are inter-wound to have positive mutual coupling, providing signal cancellation, enhancing the notch filtering and providing more rejection at the notch frequency. The peaking inductors ±Ls (216) are inter-wound to have negative mutual coupling, enhancing the signal (V positive–V negative) by enhancing peaking filtering. So the net transfer function is such that the droop of the in-band signal is reduced, and rejection of the unwanted signal (in this case DAC image that is at the DAC clock frequency) is increased.

FIG. 3 illustrates an example direct conversion TX/RX transceiver design 300, including dual TX signal chains TX301/TX302. The TX/RX transceiver 300 includes dual RX signal chains RX303/RX304. In addition, for QMC (quadrature mismatch compensation) compensation and calibration, the TX/RX transceiver includes a feedback receiver FBRX305.

Each TX signal chain TX301/TX302 includes differential IQ± signal paths implemented with an example DAC with passive reconstruction filter according to this Disclosure. TX signal chain TX301 includes an example DAC design 310 with I and Q signal paths. DAC design 310 includes an I-Path DAC 312I and a Q-Path DAC 312Q, respectively followed by passive reconstruction filters 314I and 314Q. Passive reconstruction filters 314I/314Q can be constructed according to the example passive reconstruction filters in FIG. 1 (14) and FIG. 2 (214).

The use of a passive reconstruction filter according to this Disclosure: (a) allows for a narrower transition band (signal bandwidth and DAC images can be much closer) compared to traditional active filter implementations; (b) since only passive elements are used, DC power consumption is eliminated; and (c) passive elements exhibit high linearity while contributing minimum noise and minimum in band insertion loss.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, including design examples, can be used by ordinarily skilled artisans as a basis for modifications, substitutions and alternatives to construct other embodiments, including adaptations for other applications.

The invention claimed is:

1. A circuit for analog to digital signal conversion, comprising
    a digital-to-analog converter (DAC) coupled to receive at an input an input digital data signal, to convert the digital data signal to a DAC output signal;
    a reconstruction filter to filter the DAC output signal, including
        at least one notch filter to provide notch filtering, and
        a peaking filter coupled in series with the notch filter,
    the reconstruction filter providing a filtered DAC output signal that is band limited.

2. The circuit of claim 1, wherein
    the notch filter comprises an LC notch filter with at least one notch inductor Ln and at least one notch capacitor Cn.

3. The circuit of claim 2, wherein
    the DAC comprises a differential DAC to convert the input digital data signal into differential DAC output signals at +DAC and −DAC outputs;
    the notch filter comprises a +LC notch filter coupled between the +DAC output and a circuit common, and a −LC notch filter coupled between the −DAC output and the circuit common; and
    the peaking circuit comprises a peaking inductor +Ls coupled to the +LC notch filter, and a peaking inductor −Ls coupled to the −LC notch filter.

4. The circuit of claim 3,
    wherein the ±LC notch filters respectively include ±Ln inductors, and the peaking circuit includes ±Ls inductors; and
    wherein the ±Ln notch inductors and the ±Ls peaking inductors are respectively mutually wound as single inductors.

5. The circuit of claim 3, adapted for use in a direct conversion RF transmit signal chain including an IQ± signal paths I-Path and Q-Path:
    wherein the I-Path includes an I-Path differential DAC and an I-Path reconstruction filter providing filtered I-Path differential DAC outputs I±; and
    wherein the Q-Path includes a Q-Path differential DAC and Q-Path reconstruction filter providing filtered Q-Path differential DAC outputs Q±.

6. The circuit of claim 3, wherein the peaking circuit further includes filter capacitors Cp coupled respectively between the peaking inductors ±Ls and a circuit common.

7. The circuit of claim 1, wherein the DAC and the reconstruction filter are integrated into a single integrated circuit.

8. The circuit of claim 1, wherein the at least one notch filter is connected to the DAC, and the peaking circuit is connected to the at least one notch filter, and outputs the filtered DAC output signal.

9. A DAC (digital-to-analog conversion) circuit for use in an RF (radio frequency) transmitter, comprising
    a digital-to-analog converter (DAC) coupled to receive an input digital data signal, to convert the digital data signal to a DAC RF signal;
    a reconstruction filter to filter the DAC RF signal, including
        at least one notch filter to provide notch filtering, and
        a peaking filter coupled in series with the notch filter,
    the reconstruction filter providing a filtered DAC RF signal that is band limited.

10. The DAC circuit of claim 9, wherein
    the notch filter comprises an LC notch filter with at least one notch inductor Ln and at least one notch capacitor Cn.

11. The DAC circuit of claim 10, wherein
    the DAC comprises a differential DAC to convert the input digital data signal into differential DAC RF signals at +DAC and −DAC outputs;
    the notch filter comprises a ±LC notch filter coupled between the +DAC output and a circuit common, and a −LC notch filter coupled between the −DAC output and the circuit common; and
    the peaking circuit comprises a peaking inductor ±Ls coupled to the ±LC notch filter, and a peaking inductor −Ls coupled to the −LC notch filter.

12. The DAC circuit of claim 11,
    wherein the ±LC notch filters respectively include ±Ln inductors; and
    the peaking circuit includes ±Ls inductors; and
    wherein the ±Ln notch inductors and the ±Ls peaking inductors are respectively mutually wound as single inductors.

13. The circuit of claim 11, wherein the peaking circuit further includes filter capacitors Cp coupled respectively between the peaking inductors ±Ls and a circuit common.

14. The DAC circuit of claim 11, adapted for use in a direct conversion RF transmit signal chain including an IQ± signal paths I-Path and Q-Path:
    wherein the I-Path includes an I-Path differential DAC and an I-Path reconstruction filter providing filtered I-Path differential DAC outputs I±; and
    wherein the Q-Path includes a Q-Path differential DAC and Q-Path reconstruction filter providing filtered Q-Path differential DAC outputs Q±.

15. The DAC circuit of claim 14, wherein, for both the I-Path and the Q-Path, the reconstruction filter comprises:
    ±LC notch filters with ±Ln inductors; and
    the peaking circuit including ±Ls inductors; and
    the ±Ln notch inductors and the ±Ls peaking inductors are respectively mutually wound as single inductors.

16. The DAC circuit of claim 15, wherein the peaking circuit further includes filter capacitors Cp coupled respectively between the peaking inductors ±Ls and a circuit common.

17. The DAC circuit of claim 9, wherein the at least one notch filter is connected to the DAC, and the peaking circuit is connected to the at least one notch filter, and outputs the filtered DAC RFsignal.

18. The DAC circuit of claim 9, wherein the DAC and the reconstruction filter are integrated into a single integrated circuit.

19. A method of digital-to-analog conversion for use in an RF (radio frequency) transmit (TX) signal chain, the method comprising
    converting an input digital data signal to a DAC RF signal;
    reconstruction filtering the DAC RF signal, by
        notch filtering the DAC RF signal with a notch filter an LC notch filter with at least one notch inductor Ln and at least one notch capacitor Cn, and
        filtering the notch filtered output of the notch filter with a peaking filter including a peak filtering inductor Ls to provide a filtered DAC RF signal that is band limited.

20. The method of claim 19, wherein:
    the input digital data signal is converted to differential DAC RF signals at +DAC and −DAC outputs; and
    reconstruction filtering is performed with
        a notch filter that includes a +LC notch filter coupled between the +DAC output and a circuit common, and a −LC notch filter coupled between the −DAC output and the circuit common, and
        a peaking circuit that includes a peaking inductor +Ls coupled to the +LC notch filter, and a peaking inductor −Ls coupled to the −LC notch filter.

* * * * *